United States Patent
Ide et al.

(10) Patent No.: US 7,760,473 B2
(45) Date of Patent: Jul. 20, 2010

(54) MAGNETORESISTANCE ELEMENT EMPLOYING HEUSLER ALLOY AS MAGNETIC LAYER

(75) Inventors: Yosuke Ide, Niigaka-ken (JP); Ryo Nakabayashi, Niigata-ken (JP); Masamichi Saito, Niigata-ken (JP); Naoya Hasegawa, Niigata-ken (JP)

(73) Assignee: TDK Corporation, Tokyo (JP)

( * ) Notice: Subject to any disclaimer, the term of this patent is extended or adjusted under 35 U.S.C. 154(b) by 692 days.

(21) Appl. No.: 11/676,168

(22) Filed: Feb. 16, 2007

(65) Prior Publication Data

US 2007/0201169 A1    Aug. 30, 2007

(30) Foreign Application Priority Data

Feb. 24, 2006 (JP) ............... 2006-048391

(51) Int. Cl.
*G11B 5/39* (2006.01)
(52) U.S. Cl. .................. 360/324.11
(58) Field of Classification Search ............ None
See application file for complete search history.

(56) References Cited

U.S. PATENT DOCUMENTS

| | | | | |
|---|---|---|---|---|
| 7,310,207 B2 * | 12/2007 | Hasegawa et al. | ...... | 360/324.11 |
| 7,336,453 B2 * | 2/2008 | Hasegawa et al. | ...... | 360/324.12 |
| 7,466,525 B2 * | 12/2008 | Hasegawa et al. | ...... | 360/324.12 |
| 7,480,122 B2 * | 1/2009 | Ide et al. | ............... | 360/324.12 |
| 7,554,776 B2 * | 6/2009 | Hasegawa et al. | ...... | 360/324.11 |
| 7,558,028 B2 * | 7/2009 | Carey et al. | ............ | 360/324.12 |
| 2005/0266274 A1 | 12/2005 | Hasegawa et al. | | |

FOREIGN PATENT DOCUMENTS

| | | |
|---|---|---|
| JP | 2004-146480 | 5/2004 |
| JP | 2004-214251 | 7/2004 |
| JP | 2004-524689 | 8/2004 |
| JP | 2005-116703 | 4/2005 |
| JP | 2005-347418 | 12/2005 |
| WO | 02/069356 A1 | 9/2002 |

\* cited by examiner

*Primary Examiner*—Mark Blouin
(74) *Attorney, Agent, or Firm*—Brinks Hofer Gilson & Lione

(57) ABSTRACT

An advantage of the application is to provide a magnetoresistance element capable of increasing a plateau magnetic field Hp1 while maintaining high $\Delta$RA. A magnetic layer $4c1$ adjacent to a non-magnetic material layer 5 in a second fixed magnetic layer $4c$ constituting the fixed magnetic layer 4 is formed of a first Heusler-alloy layer represented by $Co_{2x}(Mn_{(1-z)}Fe_z)_x\alpha_y$ (where the element $\alpha$ is any one element of 3B group, 4B group, and 5B group, x and y all are in the unit of at %, 3x+y=100 at %). Additionally, the content y is in the range of 20 to 30 at % and a Fe ratio z in MnFe is in the range of 0.2 to 0.8. Accordingly, the plateau magnetic field Hp1 may increase while maintaining high $\Delta$RA.

8 Claims, 7 Drawing Sheets

MAGNETORESISTANCE ELEMENT EMPLOYING HEUSLER ALLOY AS MAGNETIC LAYER

This application claims the benefit of Japanese Patent Application No. 2006-048391 filed Feb. 24, 2006, which is hereby incorporated by reference.

BACKGROUND

1. Field

The present application relates to a magnetoresistance element with a Heusler alloy as the magnetic layer, capable of increasing a plateau magnetic field Hp1 while maintaining a high (RA.

2. Description of the Related art

The patent documents described below disclose a CPP magnetic detection device in which current flows in a direction perpendicular to a film surface of each layer constituting multi-layers (for example, see [0027], etc of JP-A-2004-146480).

In the patent documents, a Heusler alloy is used in at least one layer of a free magnetic layer and a fixed magnetic layer (both layers all are described as a term of a ferromagnetic layer in JP-A-2004-146480) disclosed (see claim 2 of JP-A-2004-146480, claim 9 of JP-A-2004-214251, and claim 10 of JP-A-2005-116703).

A spin polarizability may improve more when the free magnetic layer and the fixed magnetic layer are formed of the Heusler alloy, than when the free magnetic layer and the fixed magnetic layer are formed of a CoFe alloy or a NiFe alloy. The improved polarizability leads to an increased magnetoresistance variation $\Delta R$. In a CPP magnetic detection device, the product $\Delta RA$ of the magnetoresistance variation $\Delta R$ and an element area A is a very important parameter for improving a high record density. Accordingly, it is preferable that the Heusler alloy is used in the free magnetic layer or the fixed magnetic layer.

In one embodiment, besides the $\Delta RA$, a plateau magnetic field is also an important parameter.

The plateau magnetic field Hp1 refers to a strength of an exterior magnetic field, when an exterior magnetic field is applied in a direction antiparallel to magnetization direction of the fixed magnetic layer and the magnetization in the fixed magnetic layer begins to reverse due to the exterior magnetic field.

The more intense the plateau magnetic field is, the steadier the magnetization direction of the fixed magnetic layer remains. Accordingly, a producing property can improve.

In the above patent documents, other Heusler alloys, which several have different compositions, are exemplified, but $Co_2MnGe$ or $Co_2MnSi$ having a high spin polarizability has been considered to be an appropriate material for the fixed magnetic layer or the free magnetic layer.

However, when $Co_2MnGe$ or $Co_2MnSi$ is used in the fixed magnetic layer and the free magnetic layer, the plateau magnetic field Hp1 may not be properly intense.

Additionally, the plateau magnetic field Hp1 is not described and even not mentioned at all in the prior arts described above.

SUMMARY

The present embodiments may obviate one or more of the drawbacks and limitations inherent in the related art. For example, in one embodiment, a magnetoresistance element is capable of increasing a plateau magnetic field Hp1 and maintaining a higher $\Delta RA$ than in the past art.

According to one embodiment, a magnetic detection device includes a fixed magnetic layer of which a direction of magnetization is fixed and a free magnetic layer which is formed on the fixed magnetic layer with a non-magnetic material layer interposed therebetween and of which the direction of magnetization varies by an exterior magnetic field. The fixed magnetic layer is formed of a first Heusler-alloy layer represented by $CO_{2x}(Mn_{(1-z)}Fe_z)x(y$ (where an element is any one element of 3B group, 4B group, and 5B group, x and y all are in the unit of at %, and 3x+y=100 at %), and wherein the content y is in the range of about 20 to 30 at % and a Fe ratio z in MnFe is in the range of about 0.2 to 0.8.

The plateau magnetic field Hp1 may increase while maintaining high RA. Accordingly, the magnetization of the fixed magnetic layer according to one embodiment remains stable, thereby improving a reproducing quality.

It may be preferable that the element $\alpha$ is one of Ge, Si, and Al so as to maintain high $\Delta RA$.

Additionally, it may be preferable that the first Heusler-alloy layer contacts the non-magnetic material layer so as to properly increase $\Delta RA$.

In one embodiment, the fixed magnetic layer has a laminated ferri-structure that includes a first fixed magnetic layer, a second fixed magnetic layer, a non-magnetic intermediate layer interposed therebetween. The second fixed magnetic layer contacts the non-magnetic material layer and some of the second fixed magnetic layer is formed of the first Heusler-alloy layer. The second fixed magnetic layer constituting a spin-dependent scatter section may be formed of the first Heusler-alloy layer in which the spin polarizability is large so as to improving $\Delta RA$, rather than the first fixed magnetic layer.

The free magnetic layer may be formed of a second Heusler-alloy layer represented by $Co_{2v}Mn_vGe_w$ (v and w are in the unit of at % and 3v+w=100 at %). The content w in the formula is preferable if in the range of about 21 to 27 at % so as to improve $\Delta RA$.

The plateau magnetic field Hp1 may increase while maintaining a high $\Delta RA$. Accordingly, the magnetization of the fixed magnetic layer may remain stable so as to improve a reproducing quality.

DETAILED DESCRIPTION

Figure 1:
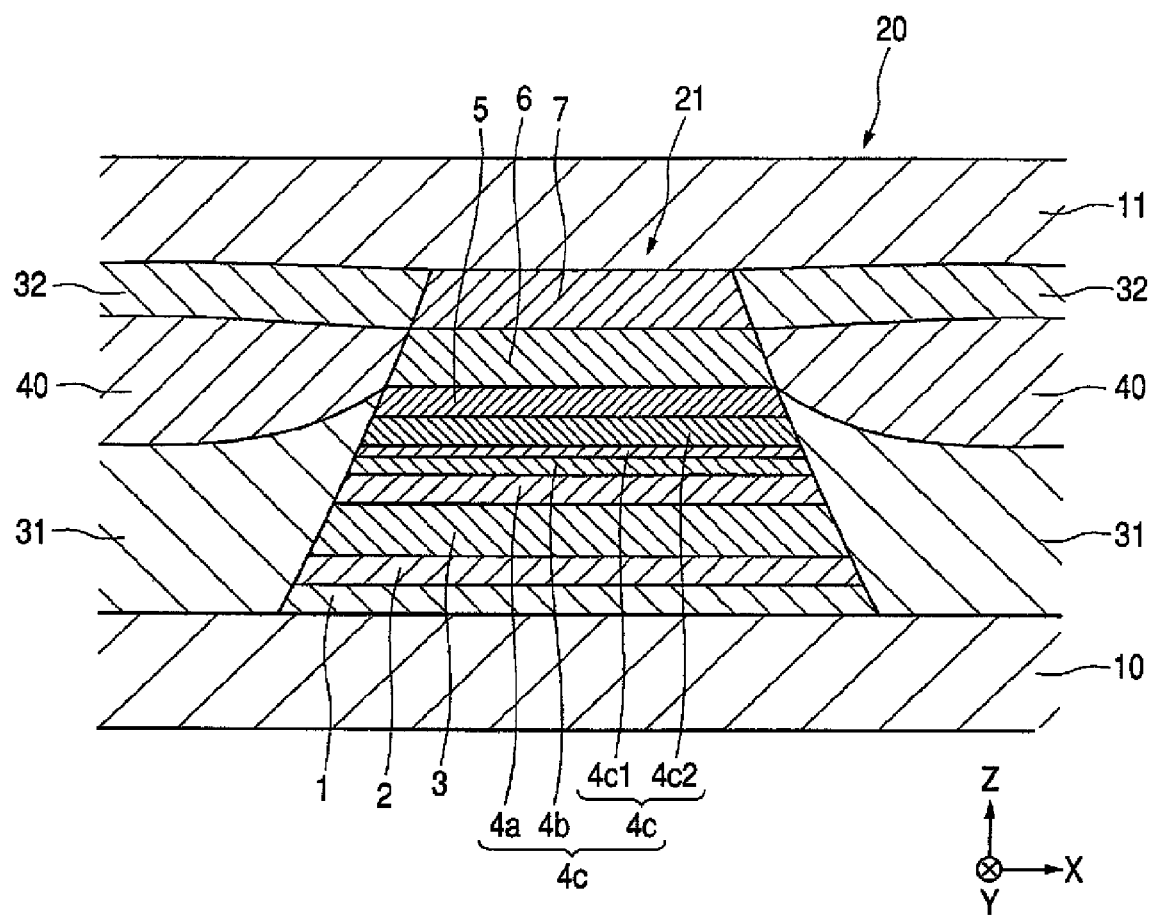
FIG. 1 is a cross-sectional view of a reproducing head (thin film magnetic head) which is cut in a direction parallel to an opposite surface of a recording media, and the reproducing head includes a CPP single spin-valve thin film element (magnetic detection device)

In one embodiment, as shown in FIG. 1, a reproducing head (thin film magnetic head) includes a CPP single spin-valve thin film element (magnetic detection device) which is cut in a plane parallel to an opposite surface of a recording media.

In one embodiment, the single spin-valve thin film element is provided in an end section of a trailing side of a floating slider so as to detect a recording field of a hard disk and the like. An X direction of the drawing indicates a direction of a track width, an Y direction indicates a direction (height direction) of a leakage field from the a magnetic recording medium, and a Z direction indicates a moving direction of a magnetic recording medium such as a hard disk and a laminated direction of the single spin-valve thin film element of each layer. Each direction is in perpendicular relation to the other two directions.

A sign indicates a lower shield layer. The single spin-valve thin film element 20 is formed on the lower shield layer. The single spin-valve thin film element 20 has a laminated body 21 in the middle of the direction of the track width (the X direction).

In the laminated body 21, a under layer 1, a seed layer 2, an antiferromagnetic layer 3, a fixed magnetic layer 4, a non-magnetic material layer 5, a free magnetic layer 6, and a protecting layer 7 are sequentially laminated.

The free magnetic layer 6 is arranged in the direction of the track width (the X direction). The fixed magnetic layer 4 has a magnetization fixed in the height direction (the Y direction). In one embodiment, as shown in FIG. 1, the fixed magnetic layer 4 has a laminated ferri-structure and magnetization of a first fixed magnetic layer 4a and magnetization of a second fixed magnetic layer 4c are set antiparallel.

As shown in FIG. 1, the laminated body 21 has an approximately trapezoidal shape in which a width size of the direction of the track width (the X direction) gradually narrows.

In both side of the track width direction of the laminated body 21, an insulating layer 31, a hard bias layer 40, and an insulating layer 32 are sequentially laminated from the bottom. An upper shield layer 11 is formed on the insulating layer 32 and the protecting layer 7.

A multilayered structure structured from the lower shield layer 10 to the upper shield layer 11 refers to a reproducing head (thin film magnetic head). The single spin-valve thin film element 20 includes the laminated body 21, the insulating layer 31, the hard bias layer 40, and the insulating layer 32. In the single spin-valve thin film element 20, the lower shield layer 10 and the upper shield layer 11 may serve as an electrode of the single spin-valve thin film element 20 and flow electric current in a direction perpendicular to interfaces constituting the laminated body 21. The structure is generally called a CCP (current perpendicular to the plane).

Each layer in FIG. 1 will be described. The under layer 1 is formed of a nonmagnetic material such as at least one element selected from Ta, Hf, Nb, Zr, Ti, Mo, and W. The seed layer 2 is formed of NiFeCr or Cr. When the seed layer 2 is formed of NiFeCr, the seed layer has a face-centered cubic (fcc) structure. An equivalent crystal plane, which is represented as a [111] plane in a direction parallel to a film plane, is aligned in the seed layer. The seed layer 2 is formed of Cr. The seed layer has a body-centered cubic (bcc) structure. An equivalent crystal plane, which is represented as a [110] plane in a direction parallel to a film plane, is aligned in the seed layer.

The antiferromagnetic layer 3 is formed of an antiferromagnetic material including an element X (where X is at least one element selected from Pt, Pd, Ir, Rh, Ru, and Os.) and Mn or an antiferromagnetic material including the element X, an element X' (where X' is at least one selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and the rare-earth elements), and Mn. The antiferromagnetic layer 3 is formed of, for example, an IrMn alloy or a PtMn alloy.

The first fixed magnetic layer 4a is formed of a ferromagnetic material such as CoFe, NiFe, and CoFeNi and the non-magnetic intermediate layer 4b is formed of a non-magnetic material such as Ru, Rh, Ir, Cr, Re, and Cu. A structure and a material of the second fixed magnetic layer 4c will be described below.

The non-magnetic material layer 5 is formed of Cu, Au or Ag. A structure and a material of the free magnetic layer 6 will be described below. The protecting layer 17 may be formed of Ta and the like.

The insulating layers 31 and 32 are formed of an insulating material such as $Al_2O_3$ or $SiO_2$. The hard bias layer 40 is formed of, for example, a Co—Pt (cobalt-platinum) alloy, a Co—Cr—Pt (cobalt-chrome-platinum) alloy, or the like. The lower shield layer 10 or the upper shield layer 11 is formed of NiFe alloy or the like.

A characteristics of a spin-valve thin film element illustrated in FIG. 1 is described.

As shown in FIG. 1, the second fixed magnetic layer 4c includes a magnetic layer 4c1 adjacent to non-magnetic intermediate layer 4b and a magnetic layer 4c2 adjacent to the non-magnetic material layer 5 in the spin-valve thin film element. The magnetic layer 4c2 adjacent to the non-magnetic material layer is in the form of a first Heusler alloy layer represented in a formula $Co_{2x}(Mn_{(1-z)}Fe_z)_xα_y$ (where an element (is any one of 3B group, 4B group or 5B group, x and y are in the unit of an at %, and 3x+y=100 at %). The content y represented by the composition formula is in the range of about 20 to 30 at % and a Fe ratio z is in the range of about 0.2 to 0.8.

The "Fe ratio z" is represented by Fe at %/(Fe at %+Mn at %).

When analyzing the composition, an SIMS analysis equipment or a nano-beam X-ray analysis (Nano-beam EDX) using a field-emission transmission electron microscopy (FE-TEM) is employed.

According to the experiment described below, and with above structure, a plateau magnetic field Hp1 can increase while maintaining a high product ΔRA of a magnetoresistance variation ΔR and an element area A.

In one embodiment, the plateau magnetic field Hp1 refers to an strength of an exterior magnetic field, when an exterior magnetic field is applied in a direction antiparallel to magnetization direction of the fixed magnetic layer and the magnetization in the fixed magnetic layer begins to reverse due to the exterior magnetic field. As shown in FIG. 1, the fixed magnetic layer 4 has the laminated ferri-structure. When an exterior magnetic field antiparallel to magnetization direction of one magnetic layer is applied to the two magnetic layers (the first fixed magnetic layer 4a and the second fixed magnetic layer 4c) of which magnetization is antiparallel fixed and the magnetization begins to reverse due to the exterior magnetic field, a strength of the exterior magnetic field is the plateau magnetic field Hp1.

The higher the plateau is, the steadier the magnetization direction of the fixed magnetic layer 4 remains. Accordingly, a producing property can improve.

In one embodiment, in a first Heusler-alloy layer, some of Mn in $Co_2MnGe$, for example, used as the prior Heusler alloy are substituted by Fe. Since the substitution of Fe for some of Mn makes a magnetostriction or a coercivity increase, it is considered that the plateau magnetic field Hp1 increases.

As described above, the Fe ratio z is in the range of about 0.2 to 0.8. When the Fe ratio z is below 0.2, the plateau magnetic field Hp1 cannot effectively increase. In one embodiment, the Fe ratio z is above 0.8, a deterioration in ΔRA increases. Accordingly, the Fe ratio z is set in the range of about 0.2 to 0.8.

According to one embodiment, the content y is set in the range of about 20 to 30 at %, but a high ΔRA may remain by using the content y. Additionally, it is preferable that the content y is about 25 at % so as to obtain a stable and high ΔRA.

The element α is any one of the 3B group, the 4B group, and the 5B group. In particular, Ge, Si, or Al may be preferably selected in the 3B group, the 4B group, and the 5B group so as to maintain the high ΔRA.

In one embodiment, as shown in FIG. 1, the magnetic layer 4c2 adjacent to the non-magnetic material layer constitutes a spin-dependent scatter section. Accordingly, when the magnetic layer 4c2 is formed of the first Heusler-alloy layer having high spin polarizability, it is preferable that the ΔRA becomes high, as described above, and the plateau magnetic field Hp1 may increase. However, when the magnetic layer 4cq is formed of the ferromagnetic material such as CeFe, NiFe, and the like, a RKKY interaction between the magnetic layer 4c1 and the first fixed magnetic layer 4a may increase so as to increase a unidirectional exchange-bias field (Hex*). Accordingly, the magnetization of the first fixed magnetic layer 4a and the second fixed magnetic layer 4c may be firmly fixed.

When the free magnetic layer 6 is formed of a second Heusler-alloy layer represented in the formula $Co_{2v}Mn_vGe_w$ (where v and w all are at % and 3v+w=100 at %.), ΔRA may preferably increase more effectively. The content w represented by the composition formula is set in the range of about 21 to 27 at %.

The free magnetic layer 6 may be formed of, for example, a $Co_2MnSi$ alloy, but in this case, a crystallization temperature of the $Co_2MnSi$ alloy is high, and specifically, an annealing process of 300° C. is required. The crystallization temperature of the second Heusler-alloy layer represented by $Co_2MnSi$ is not as high as that of the $Co_2MnSi$ alloy.

By appropriately crystallizing the Heusler alloy, the spin polarizability may increase so as to improve the ΔRA. However, when a high-temperature anneal is performed, for example, a exchanged-coupled magnetic field (Hex) between the antiferromagnetic layer 3 and the first fixed magnetic layer 4a may be degraded. Accordingly, the second Heusler-alloy layer is preferably employed in the free magnetic layer 6 so as to keep the annealing temperature low.

The crystallization temperature of the first Heusler-alloy layer employed in the magnetic layer 4c2 adjacent to the non-magnetic material layer of the fixed magnetic layer 4 become lower than that of $Co_2MnSi$ by substituting Fe for some of Mn even when Si is selected as the element α. However, in order to lower the crystallization temperature, it is better to select Ge as the element α.

For example, even when the first Heusler-alloy layer is employed in the free magnetic layer 6, the anneal temperature may be low so as to prevent the exchange-coupling magnetic field (Hex) between the antiferromagnetic layer 3 and the first fixed magnetic layer 4a, from being degraded. In contrast, the magnetostriction and coercivity of the free magnetic layer 6 may increase. Additionally, the second Heusler-alloy layer is thought to have higher spin polarization than the first Heusler-alloy layer. In order to increase the plateau magnetic field Hp1, it is important to employ the first Heusler-alloy layer in the fixed magnetic layer 4, particularly (Even when the first Heusler-alloy layer is not employed in the free magnetic layer 6, the plateau magnetic field Hp1 is not much degraded).

In one embodiment, the first Heusler-alloy layer is employed in the fixed magnetic layer 4 and the second Heusler-alloy layer is employed in the free magnetic layer 6.

The free magnetic layer 6 is formed of a single layer, but for example, the free magnetic layer 6 may be formed of a laminated structure or the laminated ferri structure as the same as the fixed magnetic layer 4. When the free magnetic layer 6 is formed of the laminated structure of the magnetic layer, it is preferable that the second Heusler-alloy layer is employed at least on the side adjacent to the non-magnetic material 5 so as to increase ΔRA. It is preferable that a soft magnetic material such as a NiFe alloy is employed in the parts except for the second Heusler-alloy layer of the free magnetic layer 6 so as to improve a reproducing sensitivity.

Figure 2:
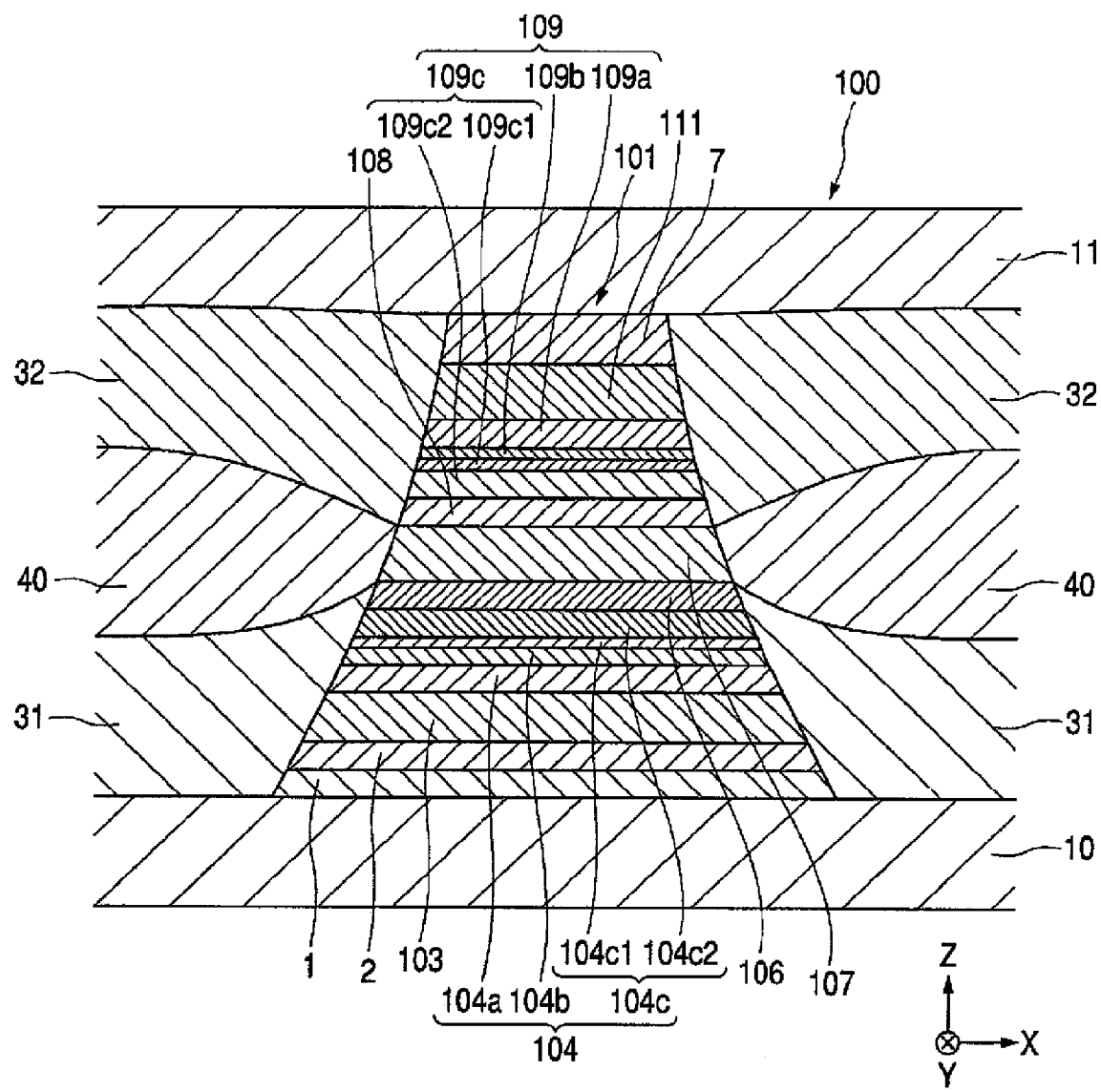
FIG. 2 is a cross-sectional view of a reproducing head (thin film magnetic head) which is cut in a direction parallel to an opposite surface of a recording media, and the reproducing head includes a CPP dual spin-valve thin film element (magnetic detection device).
Figure 3:
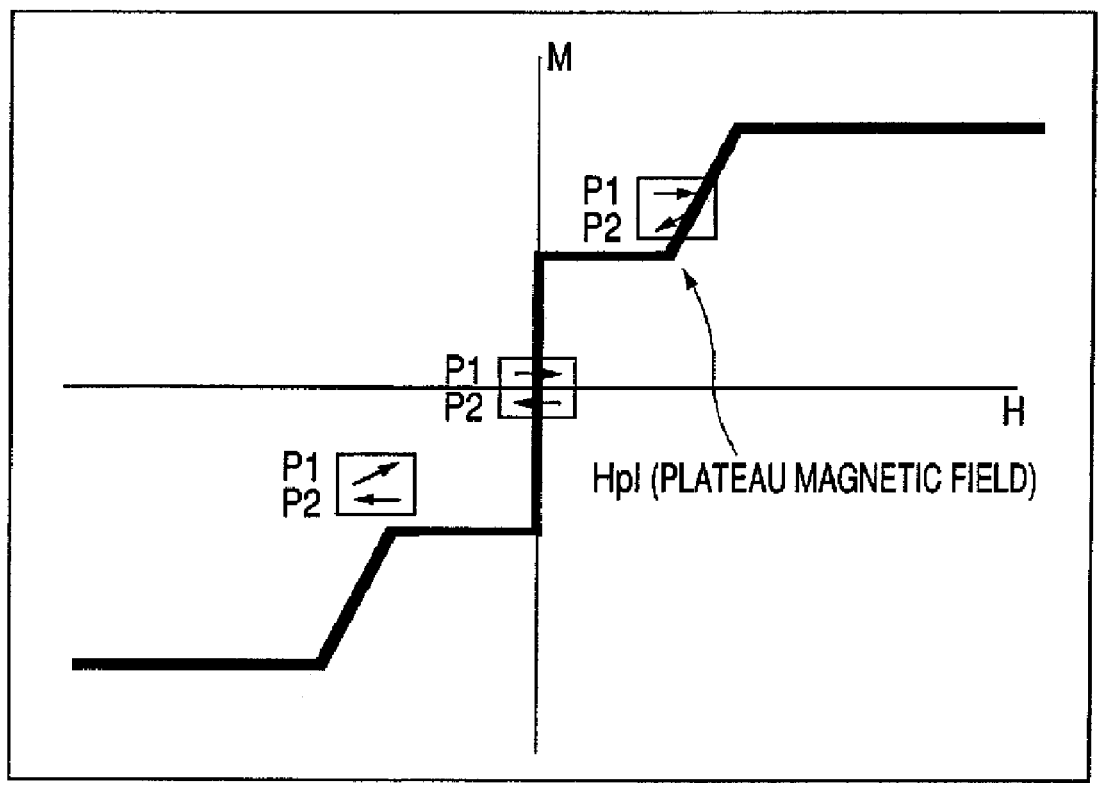
FIG. 3 is a schematic view illustrating an M-H curve in a fixed magnetic layer of a spin-valve thin film element.

FIG. 2 is a cross-sectional view of a reproducing head (thin film magnetic head) that is cut in a plane parallel to an opposite surface of a recording media and includes a CPP dual spin-valve thin film element (magnetic detection device). The same numerals as FIG. 1 denote the same layers as FIG. 1. As shown in FIG. 2, a dual spin-valve thin film element 100 is formed on the lower shield layer 10. The dual spin-valve thin film 100 has a laminated body 101 in the middle of a direction of a track width (the X direction). An under layer 1, a seed layer 2, a lower antiferromagnetic layer 103, a lower fixed magnetic layer 104, a lower non-magnetic material layer 106, a free magnetic layer 107, an upper non-magnetic material layer 108, an upper fixed magnetic layer 109, an upper antiferromagnetic layer 111, and a protecting layer 7 are sequentially laminated from the bottom in the laminated body 101.

As shown in FIG. 2, both end surfaces in the direction of the track width of the laminated body 101 are formed of inclined surfaces that gradually decrease from the bottom to the top or curved surfaces. An insulating layer 31, a hard bias layer 40, and an insulating layer 32 are sequentially laminated from the bottom on the both side of the direction of the track width of the laminated body 101.

In one embodiment, as shown in FIG. 2, an upper shield layer 11 is formed on the spin-valve thin film element 100. According to the embodiment shown in FIG. 2, the lower shield 10 and the upper shield 11 may serve as an electrode of the laminated body 101 of the spin-valve thin film element 100 and is a so-called CPP (current perpendicular to the plane) in which current flows in a direction perpendicular to each interface constituting the laminated body 101.

The lower antiferromagnetic layer 103 and the upper antiferromagnetic layer 111 shown in FIG. 2 are formed of the same material as that of the antiferromagnetic layer 3 shown in FIG. 1. The lower fixed magnetic layer 104 is formed of the laminated ferri structure that has a lower first fixed magnetic layer 104a, an upper non-magnetic intermediate layer 104b, and a lower second fixed magnetic layer 104c. The upper fixed magnetic layer 109 is formed of the laminated ferri structure that has an upper first fixed magnetic layer 109a, an upper non-magnetic intermediate layer 109b, and an upper second magnetic layer 109c. Each material of the lower fixed magnetic layer 104 and the upper fixed magnetic layer 109 is the same as that in FIG. 1. In one embodiment, a lower non-magnetic material layer 106 and an upper non-magnetic layer 108 are formed of the same non-magnetic material as that of the non-magnetic material layer 5 in FIG. 1. A free magnetic layer 107 shown in FIG. 2 is formed of the same magnetic material as that of the free magnetic layer 5 shown in FIG. 1.

In the dual spin-valve thin film element 100 shown in FIG. 2, magnetic layers 104c2 and 109c2 adjacent to the lower second fixed magnetic layer 104c and the upper second fixed magnetic layer 109c constituted in the lower fixed magnetic layer 104 and the upper fixed magnetic layer 109 respectively are formed of the first Heusler-alloy layer represented in the formula $Co_{2x}(Mn_{(1-z)}Fe_z)_x\alpha_y$ (an element $\alpha$ is one of 3B group, 4B group or 5B group, x and y all are in the unit of at %, and 3x+y=100 at %). The content y is in the range of about 20 to 30 at % and a Fe ratio z is in the range of about 0.2 to 0.8 in the composition formula.

In one embodiment, the plateau magnetic field Hp1 may increase, while maintaining the ΔRA high. Accordingly, magnetization of the fixed magnetic layers 104 and 109 may be maintained in a stable state.

The free magnetic layer 107 may be formed of the first Heusler-alloy layer, but is preferably formed of the second Heusler-alloy layer represented in the formula $Co_{2v}Mn_vGe_w$ (where v and w are at %, and 3v plus w equals 100 at %). The content w represented in the formula the composition formula is set in the range of about 21 to 27 at %, thereby more effectively increasing ΔRA.

A method of manufacturing the spin-valve thin film element 20 illustrated in FIG. 1 will be briefly described.

The under layer 1, the seed layer 2, the antiferromagnetic layer 3, the fixed magnetic layer 4, the non-magnetic material layer 5, the free magnetic layer 6, and the protecting layer 7 are sequentially laminated from the bottom on the lower shield 10 shown in FIG. 1.

When the fixed magnetic layer 4 shown in FIG. 1 is formed, the first fixed magnetic layer 4a, the non-magnetic intermediate layer 4b, and the second fixed magnetic layer 4c are sequentially laminated from the bottom. The second fixed magnetic layer 4c has a double-layer structure in which the magnetic layer 4c1 is adjacent to the non-magnetic intermediate layer 4b and a magnetic layer 4c2 is adjacent to the non-magnetic material layer 5. In this case, at least the magnetic layer 4c2 adjacent to the non-magnetic layer is formed of the first Heusler-alloy layer represented in the formula $Co_{2x}(Mn_{(1-z)}Fe_z)_x\alpha_y$ (where an element $\alpha$ is any one of 3B group, 4B group or 5B group, x and y all are in the unit of at %, and 3x+y=100 at %). The content y is in the range of 20 to 30 at % and a Fe ratio z is in the range of 0.2 to 0.8 in the composition formula.

The free magnetic layer 6 may be formed of the first Heusler-alloy layer, but is preferably formed of the second Heusler-alloy layer represented by $Co_{2v}Mn_vGe_w$ (where v and w are at %, and 3v plus w equals 100 at %). The content w represented in the composition formula is set in the range of 21 to 27 at %.

After the laminated body 21 from the under layer 1 to the protecting layer 8 is formed, a thermal treatment in the magnetic field (for example, at 290° C. for 3 to 4 hours or so). Accordingly, the exchange-coupling magnetic field (Hex) occurs between the antiferromagnetic layer 3 and the first fixed magnetic layer 4a. Further, an RKKY interaction between the first fixed magnetic layer 4a and the second fixed magnetic layer 4c occurs, and then the first fixed magnetic layer 4a and the second fixed magnetic layer 4c are magnetized antiparallel with each other in a direction parallel to the height (the Y direction)

According to one embodiment, a crystallization and crystal orderization of the magnetic layer 4c2 adjacent to the non-magnetic material layer formed of the first Heusler-alloy layer and the free magnetic layer 5 formed of the second Heusler-alloy layer may be accelerated.

As shown in FIG. 1, an etching of both end surfaces in the direction of the track width (the X direction) of the laminated body 21 is performed, and then the end surfaces in a direction parallel to a X-Z plane surface are formed in the trapezoidal shape, such that the insulating layer 31, the hard bias layer 40, and the insulating layer 32 are sequentially laminated from the bottom on both sides in the direction of the track width of the laminated body 22. The hard bias layer 40 is magnetized in the X direction and a magnetization direction of the free magnetic layer 6 is evenly arranged in the X direction.

In the method of manufacturing the spin-valve thin film element 20 according to one embodiment, the Heusler alloy may be appropriately crystallized and ordered at an anneal temperature less than 300° C. so as to prevent the exchange-coupling magnetic field (Hex) between the antiferromagnetic layer 3 and the fixed magnetic layer 4, from being degraded.

Additionally, since the plateau magnetic field Hp1 may increase, even when an unintentional high exterior magnetic field affects in the middle of manufacturing, the magnetization of the fixed magnetic layer 4 remains in a stable state.

The spin-valve thin film element 20 capable of maintaining a high ΔRA and increasing the plateau magnetic field Hp1 may be manufactured briefly or appropriately.

In the embodiment shown in FIG. 2, the laminated body 22 of the spin-valve thin film element is formed by the same manufacturing method shown in FIG. 1 except that the number of the layers shown in FIG. 2 is different from that shown in FIG. 1.

Example 1

Films were configured below. The films were as follows: an under layer was formed of Ta(30), a seed layer was formed of NiFeCr(50), an antiferromagnetic layer was formed of IrMn (70), a lower fixed magnetic layer [a lower first fixed magnetic layer] was formed of $Fe_{10\ at\ \%}Co70_{at\ \%}(30)$, a lower non-magnetic intermediate layer was formed of Ru(9.1), a magnetic layer adjacent to a non-magnetic material layer was formed of $Co_2(Mn_{1-z}Fe_z)\alpha(40)$, a lower non-magnetic material layer was formed of Cu(50), a free magnetic layer was formed of $Co_2(Mn_{1-z}Fe_z)\alpha(80)$, an upper non-magnetic material layer was formed of Cu(50), a free magnetic layer was formed of $C0_2(Mn_{1-z}Fe_z)\alpha(80)$, an upper non-magnetic material layer was formed of Cu(50), an upper fixed magnetic layer [a magnetic layer adjacent to a non-magnetic material layer] was formed of $Co_2(Mn_{1-z}Fe_z)\alpha(40)$, a magnetic layer adjacent to a non-magnetic intermediate layer was formed of $Fe_{10\ at\ \%}Co_{60\ at\ \%}(30)$, an upper antiferromagnetic layer was formed of IrMn, and a protecting layer was formed of Ta(200). In this embodiment, Ge or Si was used as an element $\alpha$. The numbers in the parentheses referred to a thickness of the films and a unit was Å. A thermal treatment for a configuration of the films was performed at 290° C. for 3.5 hours in a magnetic field of 10 kOe (about 790 kA/m).

A plateau magnetic field Hp1 was measured, in relation to a varied Fe ratio z of $Co_2(Mn_{1-z}Fe_z)\alpha$ constituting a magnetic layer adjacent to non-magnetic material layer. When the element $\alpha$ is formed of Ge, an unidirectional exchange-bias field (Hex*) and magnetization $\lambda S$ were measured. The result of each experiment is shown in FIGS. 4 to 7. The Fe ratio z is represented as at %/(Fe at %+Mn at %).

Figure 4:
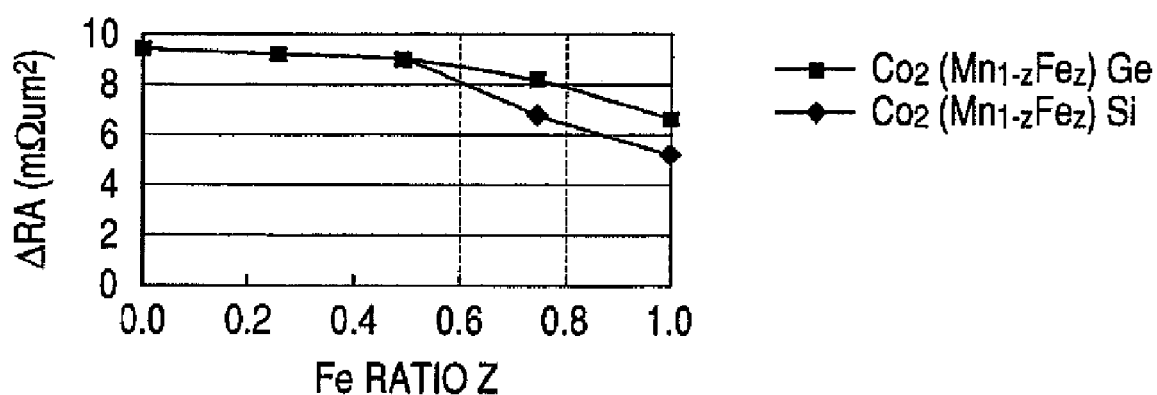
FIG. 4 is a graph showing a relationship of an Fe ratio z and a plateau magnetic field Hp1 when a magnetic layer adjacent to a non-magnetic material layer constituting a fixed magnetic layer and a free magnetic layer are formed of $Co_2(Mn_{1-z}Fe_z)$ Ge or $Co_2(Mn_{1-z}Fe_z)$ Si.

As shown in FIG. 4, an increase in the Fe ratio z led to a decline in $\Delta RA$. This is because the increase in the Fe ratio z led to a decline in a spin polarization.

Alternatively, the increase in the Fe ratio z led to an increase in the plateau magnetic field Hp1. The reason that the plateau magnetic field Hp1 increased was because a magnetostrition or a coercivity of a second fixed magnetic layer constituting the fixed magnetic layer increased.

Figure 6:
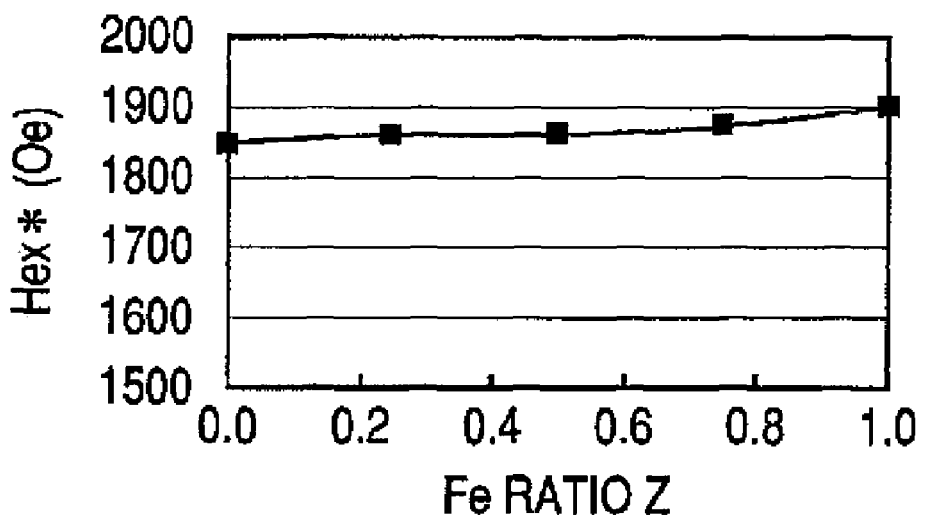
FIG. 6 is a graph showing a relationship of Fe ratio z and a unidirectional exchanged-bias field (Hex*) when a magnetic layer adjacent to a non-magnetic material layer constituting a fixed magnetic layer and a free magnetic layer are formed of $Co_2(Mn_{1-z}Fe_z)Ge$ or $Co_2(Mn_{1-z}Fe_z)Si$.

Additionally, as shown in FIG. 6, it was found that even the Fe ratio z changed, the unidirectional exchange-bias field (Hex*) changed little. In this case, the unidirectional exchange-bias field (Hex*) refers to an integrated strength of an exchange-coupled magnetic field between the fixed magnetic layer and the antiferromagnetic layer and an exchange-coupling magnetic field of an RKKY interaction between the magnetic layers constituting the fixed magnetic layer.

Figure 7:
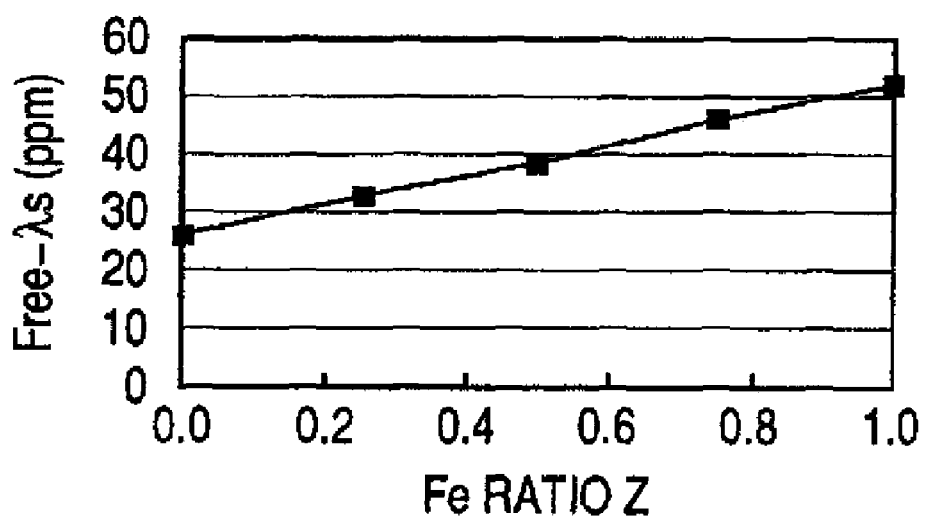
FIG. 7 is a graph showing a relationship of Fe ratio z and a magnetostriction λs of a free magnetic layer when a magnetic layer adjacent to a non-magnetic material layer constituting a fixed magnetic layer and the free magnetic layer are formed of $Co_2(Mn_{1-z}Fe_z)Ge$ or $Co_2(Mn_{1-z}Fe_z)Si$.

As shown in FIG. 7, the increase in the Fe ratio z led to a gradual increase in the magnetization of the free magnetic layer.

The above-experiment was performed by using Ge or Si as the element $\alpha$, and besides Ge or Si, an experiment was also performed by using Al.

When the magnetic layer adjacent to the non-magnetic material layer and the free magnetic layer were formed of $Co_{2x}Fe_xAl_y$, $Co_{2x}Fe_xSi_y$, or $Co_{2x}Fe_xGe_y$ (however, in a case of a Heusler alloy, 3x plus y equals 100 at %), a relationship between a composition ratio y and $\Delta RA$ was measured in the experiment.

Figure 8:
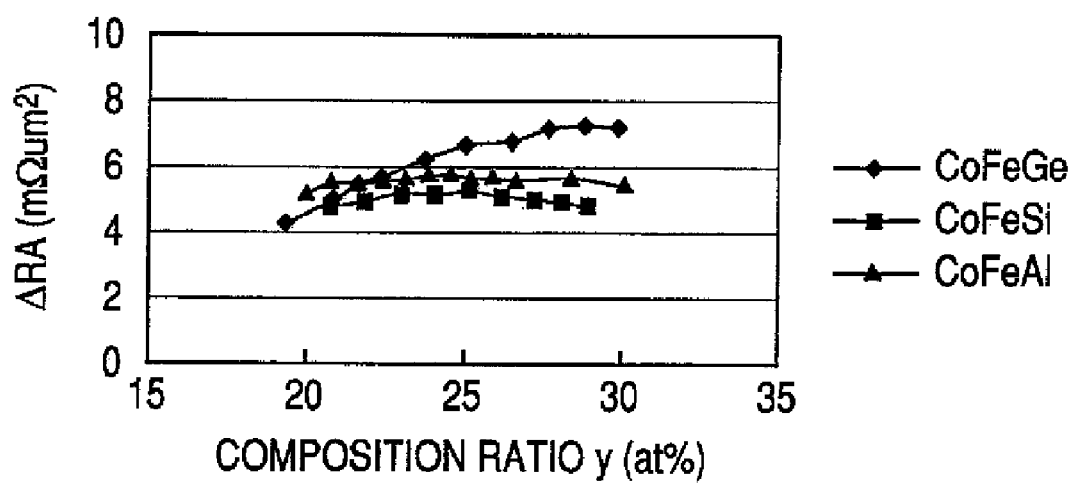
FIG. 8 is a graph showing a relationship of each composition ratio y of Heusler alloys and ΔRA when a magnetic layer adjacent to a non-magnetic material layer constituting a fixed magnetic layer and the free magnetic layer are formed of $Co_{2x}Fe_xAl_y$, $Co_{2x}Fe_xSi_y$, or $Co_{2x}Fe_xGe_y$ (in each of the Heusler alloys, 3x plus y equals 100 at %).

As shown in FIG. 8, when any one of Ge, Si, and Al was used as the element $\alpha$, $\Delta RA$ changed little in the range of 10 at % to 25 at % of the composition ratio y. However, when the composition ratio y is 25 at % or more, it was better to select Ge as the element $\alpha$ so as to obtain a larger $\Delta RA$.

A three element system of $CoFe\alpha$ was used in FIG. 8 not a Heusler alloy that constitutes four element system of CoMnFe$\alpha$. However, it was supposed that CoMnFeAl, rather than CoFeAl, increases $\Delta RA$ while taking account of the tendency in FIG. 4. Additionally, values of (RA little changed little in the range of 20 at % to 30 at % of the composition ratio y in FIG. 8 even when any one of Heusler alloys was used.

Accordingly, it was supposed that a similar (RA may be obtained at the time of using CoMnFeAl as the same as at the time of using CoMnFeSi and CoMnFeGe.

As described in FIG. 7, the magnetostriction of the free magnetic layer also increased in the free magnetic layer at the time of using a CoFnFeGe alloy. An increase in the magnetostriction and coercivity led to a decrease in a sensitivity. Accordingly, it is preferable that the magnetostriction of the free magnetic layer is as small as possible.

That is, ilt is preferable to select the Heusler alloy in the free magnetic layer, in that the Heusler alloy has a high spin polarization and has a capability of decreasing the magnetostriction and coercivity of the free magnetic layer.

The free magnetic layer was formed of CoMnGe, and the magnetic layer adjacent to the non-magnetic material layer was formed of CoMnFec$\alpha$ such that $\Delta RA$ and the plateau magnetic field Hp1 were measured. The films in the experiment were as follows: the under layer was formed of Ta(30), the seed layer was formed of NiFeCr(50), the antiferromagnetic layer was formed of IrMn(70), the lower fixed magnetic layer [a lower first fixed magnetic layer] was formed of $Fe_{10\ at\ \%}Co70_{at\ \%}(30)$, the lower non-magnetic intermediate layer was formed of Ru(9.1), the magnetic layer adjacent to a non-magnetic material layer was formed of $Co_2(Mn_{1-z}Fe_z)\alpha$ (40), the lower non-magnetic material layer was formed of Cu(50), the free magnetic layer was formed of $Co_2(Mn_{1-z}Fe_z)\alpha(80)$, the upper non-magnetic material layer was formed of Cu(50), the free magnetic layer was formed of $Co_2(Mn_{1-z}Fe_z)\alpha(80)$, the upper non-magnetic material layer was formed of Cu(50), the upper fixed magnetic layer [the magnetic layer adjacent to a non-magnetic material layer] was formed of $Co_2(Mn_{1-z}Fe_z)\alpha(40)$, the magnetic layer adjacent to the non-magnetic intermediate layer was formed of $Fe_{10\ at\ \%}Co_{60\ at\ \%}(30)$, the upper antiferromagnetic layer was formed of IrMn, and the protecting layer was formed of Ta(200). In this case, as an element $\alpha$, Ge or Si was used. The numbers in the parentheses referred to a thickness of the films and a unit was Å. A thermal treatment for a configuration of the films was performed at 290° C. for 3.5 hours in a magnetic field of 10 kOe(about 790 kA/m).

Figure 9:
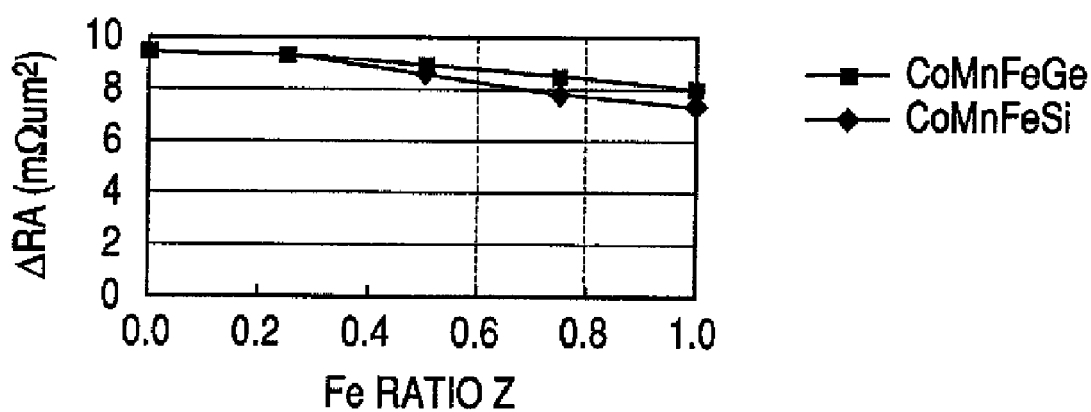
FIG. 9 is a graph showing a relationship of a Fe ratio z and ΔRA when a magnetic layer adjacent to a non-magnetic material layer constituting a fixed magnetic layer is formed of $Co_2(Mn_{1-z}Fe_z)Ge$ or $Co_2(Mn_{1-z}Fe_z)Si$ and the free magnetic layer is formed of $Co_2MnGe$.
Figure 10:
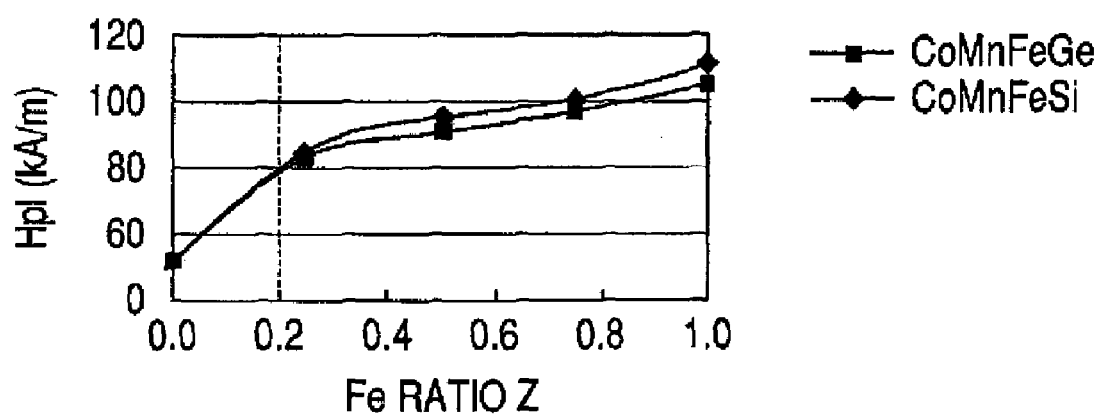
FIG. 10 is a graph showing a relationship of a Fe ratio z and a plateau magnetic field Hp1 when a magnetic layer adjacent to a non-magnetic material layer constituting a fixed magnetic layer is formed of $Co_2(Mn_{1-z}Fe_z)Ge$ or $Co_2(Mn_{1-z}Fe_z)Si$ and the free magnetic layer is formed of $Co_2MnGe$.

A plateau magnetic field Hp1 was measured, in relation to a varied Fe ratio z of $Co_2(Mn_{1-z}Fe_z)\alpha$ constituting a magnetic layer adjacent to non-magnetic material layer. Each of the results is shown in FIGS. 9 and 10. The Fe ratio z is represented as at %/(Fe at %+Mn at %).

As shown in FIG. 9, like the result of the experiment was shown in FIG. 4, $\Delta RA$ was inclined to decrease in the time when the Fe ratio z increased. However, a decrease rate in $\Delta RA$ was less than the result in FIG. 4.

Figure 5:
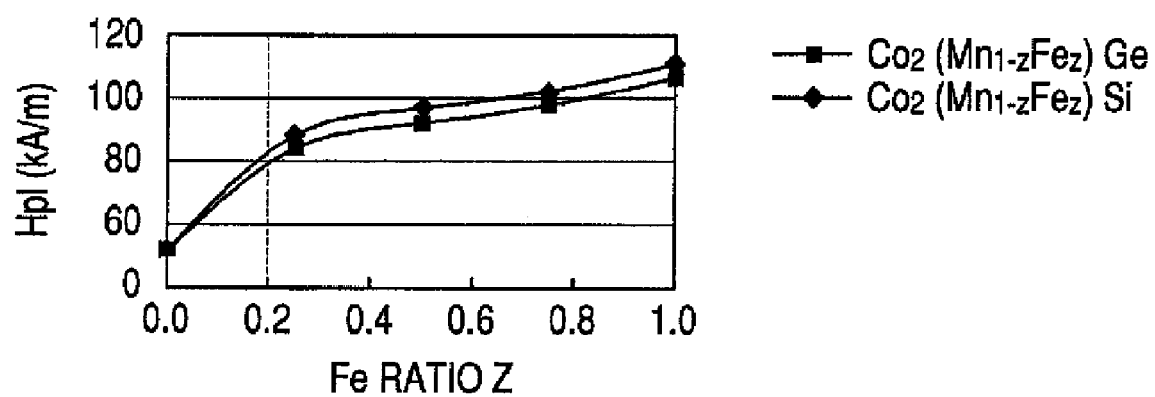
FIG. 5 is a graph showing a relationship of Fe ratio z and a plateau magnetic field Hp1 when a magnetic layer adjacent to a non-magnetic material layer constituting a fixed magnetic layer and a free magnetic layer are formed of $Co_2(Mn_{1-z}Fe_z)Ge$ or $Co_2(Mn_{1-z}Fe_z)Si$.

Alternatively, as shown in FIG. 10, like the result of the experiment was shown in FIG. 5, the plateau magnetic field Hp1 was inclined to increase in the time when the Fe ratio z increased. However, an increase rate was not different from the result of the experiment in FIG. 5.

On the basis of the FIGS. 4 to 7, 9 and 10, the Fe ratio z set in the range of 0.2 to 0.8. Accordingly, while the high $\Delta RA$ is maintained, the plateau magnetic field Hp1 could increase. In particular, it was possible to obtain $\Delta RA$ of 6 m((m2 or more and the plateau magnetic field of 1000 e (about $79 \times 10^2$ A/m) or more. Further, it was more preferable that the Fe ratio z was set in the range of 0.2 to 0.6, thereby obtaining high $\Delta RA$ of 8 m$\Omega\mu$m2 or more.

Figure 11:
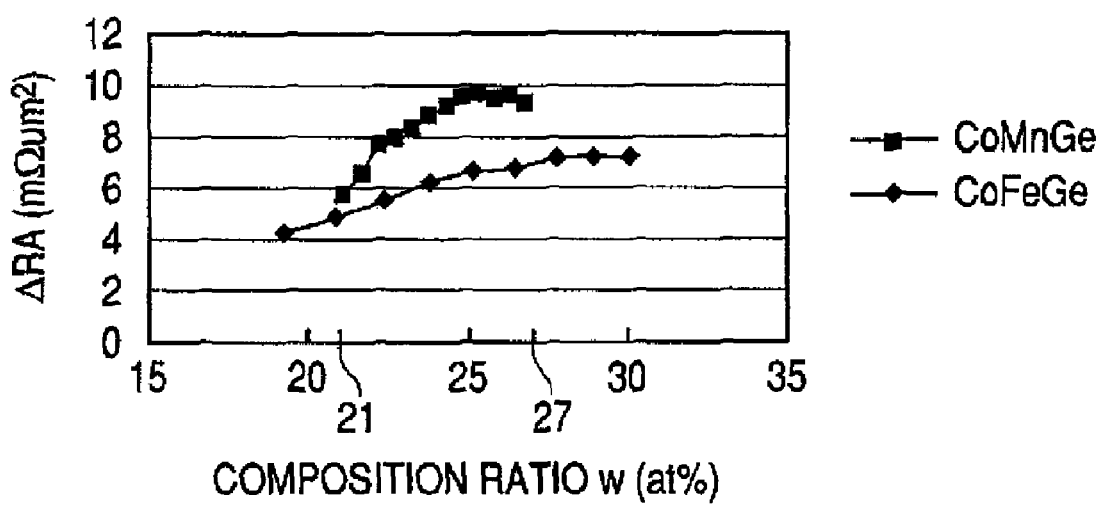
FIG. 11 is a graph showing a relationship of a composition ratio w of each Heusler alloy and ΔRA when a magnetic layer adjacent to a non-magnetic material layer constituting a fixed magnetic layer is formed of Heusler alloys represented by $Co_{2v}Mn_vGe_w$ (v and w all are at % and 3v plus w equals 100 at %) and $Co_{2v}Fe_vGe_w$.

FIG. 11 is a graph showing a relationship between the composition ratio w and $\Delta RA$ when the free magnetic layer adjacent to non-magnetic material layer and the free magnetic layer were formed of the Heusler alloy represented in the formula Co2vMnvGew (where v and w all are at % and 3v plus w equals 100 at %). Additionally, in the experiment in FIG. 11, the relationship between the composition ratio w and ΔRA was measured when the free magnetic layer adjacent to non-magnetic material layer and the free magnetic layer were formed of the Heusler alloy represented in the formula $Co_{2v}Fe_vGe_w$ (where v and w all are at % and 3v plus w equals 100 at %).

As shown in FIG. 11, (RA increased more in the experiment in which the free magnetic layer adjacent to non-magnetic material layer and the free magnetic layer were formed of the Heusler alloy represented by Co2vMnvGew (where v and w all are at % and 3v plus w equals 100 at %) than in that in which the free magnetic layer adjacent to non-magnetic material layer and the free magnetic layer were formed of the Heusler alloy represented in the formula Co2vFevGew (where v and w all are at % and 3v plus w equals 100 at %).

A more preferred method of maintaining a high ΔRA, while increasing the plateau magnetic field Hp1 was that the magnetic layer adjacent to the non-magnetic material layer constituting the fixed magnetic layer was formed of the $Co_{2x}(Mn_{(1-z)}Fe_z)_x\alpha$ alloy and the free magnetic layer was formed of $Co_{2v}Mn_vGe_w$ in the experiment results in FIGS. 9 to 11. Further, the composition ratio w is set in the range of 21 at % to 27 at % from the experiment result in FIG. 11.

Various embodiments described herein can be used alone or in combination with one another. The forgoing detailed description has described only a few of the many possible implementations of the present invention. For this reason, this detailed description is intended by way of illustration, and not by way of limitation. It is only the following claims, including all equivalents that are intended to define the scope of this invention.

The invention claimed is:

1. A magnetic detection device, comprising:
   a fixed magnetic layer having a fixed magnetization; and
   a free magnetic layer being formed on the fixed magnetic layer with a non-magnetic material layer interposed therebetween and having a magnetization varied by an exterior magnetic field,
   wherein the fixed magnetic layer has a laminated ferri-structure including a first fixed magnetic layer, a second fixed magnetic layer, and a non-magnetic intermediate layer interposed therebetween, and the second fixed magnetic layer contacts the non-magnetic material layer,
   wherein a part of the second fixed magnetic layer is formed of a first Heusler-alloy layer represented in a formula $Co_{2x}(Mn_{(1-z)}Fe_z)_x\alpha_y$ (where an element α is an element selected from 3B group, 4B group, and 5B group of the old International Union of Pure and Applied Chemistry periodic table of the elements, x and y are in the unit of at %, and 3x+y=100 at %), and
   wherein the content y is in the range of about 20 to 30 at % and a Fe ratio z in MnFe is in the range of about 0.2 to 0.8.

2. The magnetic detection device according to claim 1, wherein the element α is Ge, Si, or Al.

3. The magnetic detection device according to claim 1, wherein the first Heusler alloy layer contacts the non-magnetic material layer.

4. The magnetic detection device according to claim 1, wherein the free magnetic layer is formed of a second Heusler-alloy layer represented by $Co_{2v}Mn_vGe_w$ (where v and w are in the unit of at % and 3v+w=100 at %) and the content w is in the range of about 21 to 27 at %.

5. A method of manufacturing a spin-valve thin film element, the method comprising:
   forming an under layer, a seed layer, a antiferromagnetic layer, a fixed magnetic layer, a non-magnetic material layer, a free magnetic layer, and a protecting layer on a lower shield; and
   forming the fixed magnetic layer to include a first fixed magnetic layer, a non-magnetic intermediate layer, and a second fixed magnetic layer, and the second fixed magnetic layer has a double-layer structure in which a magnetic layer is disposed adjacent to the non-magnetic intermediate layer and another magnetic layer is disposed adjacent to the non-magnetic material layer, and wherein the magnetic layer disposed adjacent to the non-magnetic layer is formed of a first Heusler-alloy layer represented in the formula $Co_{2x}(Mn_{(1-z)}Fe_z)_x\alpha_y$ (where an element α is a element selected from 3B group, 4B group or 5B group of the old International Union of Pure and Applied Chemistry periodic table of the elements, x and y all are in the unit of at %, and 3x+y=100 at %), and the content y is in the range of 20 to 30 at % and a Fe ratio z is in the range of 0.2 to 0.8 in the composition formula.

6. The method of manufacturing a spin-valve thin film element according to claim 5, wherein the free magnetic layer is formed of a second Heusler-alloy layer represented by $Co_{2v}Mn_vGe_w$ (where v and w are at %, and 3v plus w equals 100 at %), and
   the content w is represented in the composition formula set in the range of about 21 to 27 at %.

7. The method of manufacturing a spin-valve thin film element according to claim 5, further comprising thermally treating the spin-valve thin film element in the magnetic field.

8. The method of manufacturing a spin-valve thin film element according to claim 7, wherein the spin-valve thin film element is thermally treated at 290° C. for approximately 3 to 4 hours.

* * * * *